United States Patent [19]

McConnell

[11] Patent Number: 4,884,272
[45] Date of Patent: Nov. 28, 1989

[54] MAXIMUM LIKELIHOOD DIVERSITY RECEIVER

[76] Inventor: Peter R. H. McConnell, 5970 Empress Ave., Burnaby, British Columbia, Canada, V5E 2S2

[21] Appl. No.: 154,218

[22] Filed: Feb. 10, 1988

[51] Int. Cl.$^4$ ............................................. G06F 11/10
[52] U.S. Cl. ..................................................... 371/43
[58] Field of Search ........................ 371/43, 44, 45, 37

[56] References Cited

U.S. PATENT DOCUMENTS

| | | | |
|---|---|---|---|
| 4,178,550 | 12/1979 | Acampora | 371/43 X |
| 4,328,582 | 5/1982 | Battail et al. | 371/37 |
| 4,404,674 | 9/1983 | Rhodes | 371/43 |
| 4,696,058 | 9/1987 | Kawasaki et al. | 455/277 |
| 4,709,377 | 11/1987 | Martinez | 371/43 X |
| 4,715,037 | 12/1987 | Yagi | 371/43 |
| 4,742,533 | 5/1988 | Weidner | 371/43 X |
| 4,748,626 | 5/1988 | Wong | 371/43 X |
| 4,763,331 | 8/1988 | Maisumoto | 371/43 X |

OTHER PUBLICATIONS

Mobile Communications Design Fundamentals, William Lee.

Primary Examiner—Jerry Smith
Assistant Examiner—Robert W. Beausoliel
Attorney, Agent, or Firm—Cecil A. Rowley; Donald B. Southard

[57] ABSTRACT

A communication system utilizing a plurality of receiving antenna which receive digital signals and process all of the received signals in the same trellis type decoder. Hamming weights are applied to each of the signals in accordance with the Viterbi algorithm with only the minimum Hamming weight for any one state transition path between any two levels in the trellis being retained. At the intersection of any two paths in the trellis, the path with the minimum Hamming weight is retained and the other path is discarded.

2 Claims, 4 Drawing Sheets

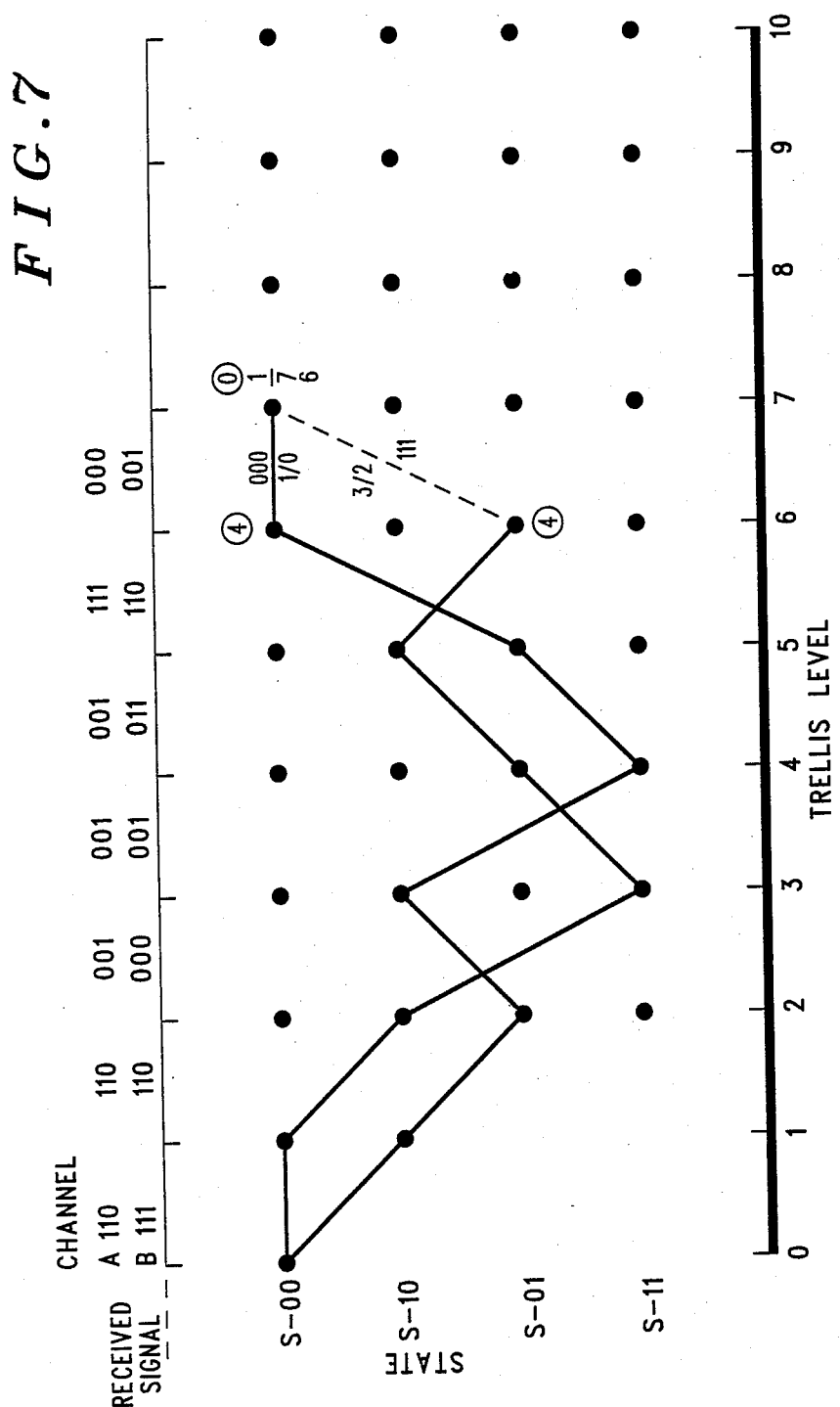

MAXIMUM LIKELIHOOD DIVERSITY RECEIVER

FIELD OF THE INVENTION

The present invention relates to a multi receiver (antenna) diversity receiver. More particularly the present invention relates to a multi receiver (antenna) diversity receiver wherein all of the received signals are continuously processed in a trellis type error correction system to determine the most likely path.

BACKGROUND TO THE PRESENT INVENTION

The use of a plurality of receivers and/or antemae in a diversity scheme are generally based either on selecting the antenna delivering the strongest received signal strength or having the largest signal to noise ratio. The decoder is switched from one signal to another on various bases, and only decodes the selected signal. The conventional basis for changing receivers and/or antemnas are:

A. Selective Combining: uses a plurality of receivers and antenna and simply selects strongest of the received signals.

B. Switched Combining: uses a single receiver with a plurality of antemae and only switches from the current signal (antenna) when the strength of the current signal is reduced below a preset level.

C. Maximum-Ratio Combining: uses a plurality of receivers and antemae, weights the signals, co-phases and combines them to provide a combined signal which is the sum of the instantaneous signal-to-noise ratios of the individual branches.

D. Equal-Gain Combining: uses a plurality of receivers, co-phase and combines the signals by bringing all phases to a common point and combines them to provide a signal that is the sum of the instantaneous fading envelopes from each receiver.

A type following system B above which minimizes the equipment and still provides a corrected signal (uses a single receiver between a pair of antemas) is described for example in U.S. Pat. No. 4,696,058 issued Sept. 22, 1987 to Tachita et al.

U.S. Pat. No. 4,328,582 issued May 4, 1982 to Battail et al discloses a system using parallel channels with binary signaling and weighs the binary values by a metric based on the bit error rate to provide a binary value with a maximum likelihood of being correct by calculating the error probability for each signal and applying the optimum decision rule to obtain the most likely binary value.

U.S. Pat. No. 4,404,674 issued Sept. 13, 1983 to Rhodes is somewhat similar to the system described in the U.S. patent to Battail et al discussed above, but applies reliability numbers based on hard-detected code symbols and bases the decoding decision on these numbers to obtain the most reliable signal.

BRIEF DESCRIPTION OF THE PRESENT INVENTION

It is an object of the present invention to provide a maximum likelihood diversity receiver capable of decoding with excellent accuracy a transmitted signal received by at least two site spaced antemaes, each having its own associated receiver.

Broadly, the present invention comprises a radio communication system including at least two site located, spaced receiving antemae each having its own associated receiver receiving a digital signal, processing each of said digital signals in a trellis type decoder, applying Hamming weights to each of said signals in accordance with the Viterbi algorithm and retaining only the minimum Hamming weight for each transition from one level to a next level in said trellis decoder, accumulating said minimum Hamming weights for each path traversing levels through said trellis decoder and selecting a maximum likelihood path at any point of intersection of two transitions at a level in said trellis based on the lowest metric Hamming weight accumulated in the paths leading to said intersection and discarding the other transition leading to said intersection.

The invention is related to a maximum likelihood diversity receiver comprising at least two receivers at a receiving site and each of said receivers having its own antenna, said antenna being separated by a distance to provide a low correlation coefficient between the signals received by said antemae, each said receiver generating a demodulated signal, a state transition manager applying Hamming weights to the demodulated signal received by each receiver for all possible state transitions between each level in a trellis type decoder based on a known starting state, selecting the minimum Hamming weight for each transition from one level to the next in said trellis, retaining only the minimum Hamming weight for each said transition regardless of the receiver source, path memory means for accumulating the minimum Hamming weights for each level in said trellis into a metric for each path traversing levels in said trellis until a pair of said paths intersect at a level, means for selecting the most likely path to said intersection based on the one of said intersecting paths having the metric with the minimum Hamming weight and discarding the other path leading to the intersection and continuing the process until only a single path remains and decoding a message based on the remaining single path.

BRIEF DESCRIPTION OF THE DRAWINGS

Further features, objects and advantages will be evident from the following detailed description of the preferred embodiments of the present invention taken in conjunction with the accompanying drawings, in which:

FIGS. 3 and 7 illustrate a sequence of trellis levels for signals processed in accordance with the present invention providing one example of the present invention.

DESCRIPTION OF THE PREFERRED EMBODIMENTS

Figure 1:
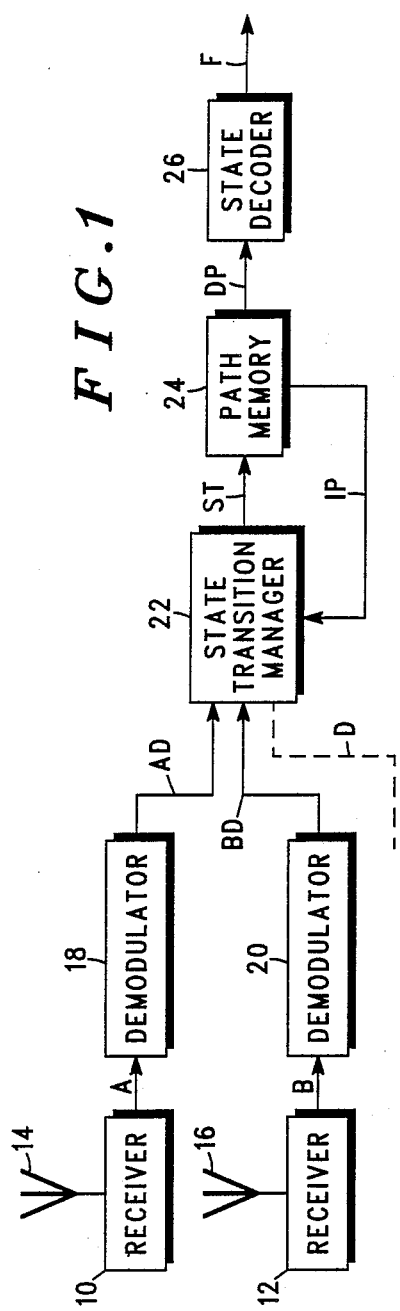
FIG. 1 is a schematic illustration of one form of the present invention.

As shown in FIG. 1 the present invention is composed of at least two receivers 10 and 12 each having its own independent antenna 14 and 16 respectively which will be spaced as is well known so that there is a low correlation coefficient between the signals received by the antemae (about 0.25% or less) or generally by at least one-half a wave length of the transmitted signal that is to be received. The signal received by receiver 10 is transmitted as indicated by line A to a demodulator 18 while the signal received by receiver 12 is passed to demodulator 20 via line B. The demodulated signal from demodulator 18 is carried by line AD to the State transition manager 22 and the demodulated signal from the demodulator 20 is carried by line BD to the state transition manager 22. Demodulated signals from other receivers (not shown) where other receivers are to be used are introduced to the state transition manager 22 via suitable lines such as that schematically indicated by the dash line D.

The state transition manager has four main functions that will be described in detail hereinbelow. These functions are:

1. Measuring the Hamming weight for all possible state transition paths in a trellis.
2. Knowing the starting state for each trellis level determining the most likely end state for that level.
3. Discarding all possible transition paths except the most likely one to each state.
4. Passing the most likely state transition via line ST to the path memory station 24.

The path memory 24 passes information back to the state transition manager 22 via the line IP, which indicates the instantaneous position and where the transition is being made to for each possible starting state. This information transmitted via line IP will include information about the first two levels of the trellis since there will not be transitions from all four states in the trellis at these levels, i.e., there are only two possible paths from the starting position to two states and only paths to three states from level 1 in the example described herein. Similarly, information must be given for the last two levels of the trellis as at these levels there again cannot be transitions to all four states of the trellis in the example used. At the penultimate level there will only be paths to two states and in the final level the paths must lead to a single state.

When the path in the path memory 24 has been reduced to a single path which is the path having the maximum likelihood, this defined path is then passed on to state decoder 26 via line DP where the message is decoded and the decoded message passed on to other equipment via line F indicating the final message.

Figure 2:
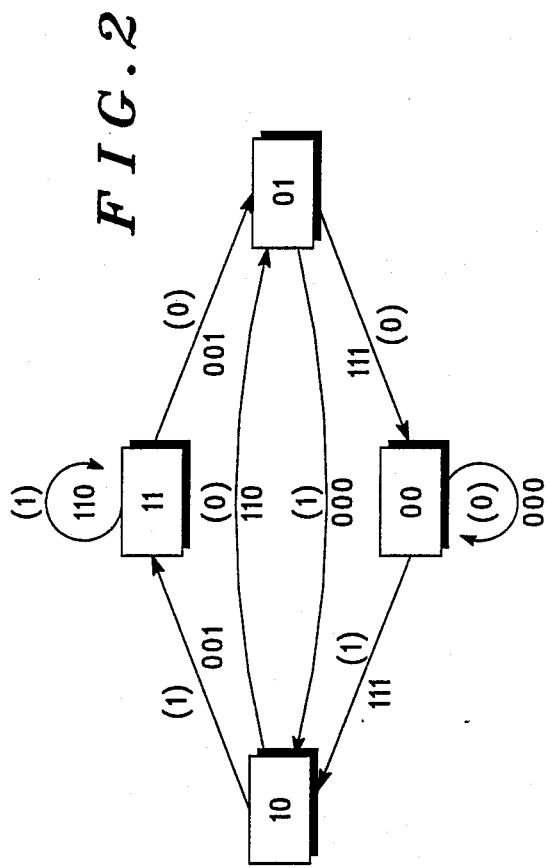
FIG. 2 is a schematic illustration of a typical allowed transition system from each of the four states (00, 01, 10, and 11,)

Attention is now directed to FIG. 2 which illustrates a diagram illustrating a typical trellis system that may be used with the present invention. In the system illustrated, a data bit ratio or code rate of 1/3 is used by way of example. Assuming commencement in state S-00 (lowermost box), then to transmit a (1) data bit, the signal 111 is transmitted. To transmit a (0) data bit the signal 000 is transmitted. From the state S-00 only the two signals 111 or 000 can be transmitted to move through a level; 000 results in no change in state, i.e., remaining in state S-00 and, as above indicated, signifies a (0) data bit; or 111, which causes transition to state S-10 and transmission of a (1) data bit. From the state S-10, as indicated by the arrows, if a (1) data bit From the state, the signal transmitted is effected 001 and transition is to state S-11, whereas, if a (0) data bit is to be sent, the signal transmitted is effected 110 and the transition is to state S-01. In the binary system there can only be two different data bits transmitted, hence there are only two arrows leading from each of the states. Thus there are only two possible transitions from each state. In FIG. 2, the signal necessary to generate each transition and the corresponding data bit each signal represents are indicated for each of the transitions.

The Hamming weights are determined by the Viterbi algorithm which compares the signal received by a given receiver with the signal that would have had to be transmitted to follow each of the possible transitions between the levels in the trellis and determines the difference between these two signals, i.e., the signal received and the one required to pass to each of the permitted states in the next level of the trellis, to determine the Hamming weight for each received signal. The Viterbi algorithm is also used to accumulate the metric of Hamming weights for each path through the trellis.

A particular example of the present invention is illustrated in FIGS. 3 to 7. In each of these Figures the States are indicate on the left hand margin as states S-00, S-10, S-01, and S-11 and are equivalent to the same states in FIG. 2. The levels in the trellis are numbered 1, 2, 3, 4, etc., along the bottom axis and the signals received by transmitted A and B are listed at the top of each Figure on lines A and B respectively. The necessary signal to have been transmitted to follow a given state transition path across a level is provided adjacent its respective path (not all such signals have been so identified) and the Hamming weights for received signals A and B have been shown as the A/B adjacent each path (not all Hamming weights are shown.)

In the disclosed system, the coordinates of a point on the trellis are designated by its level number in the trellis followed by the state. For example, the first level in the trellis in State S-00 is written 1,S-00. The starting position is defined by 0,S-00.

Figure 3:
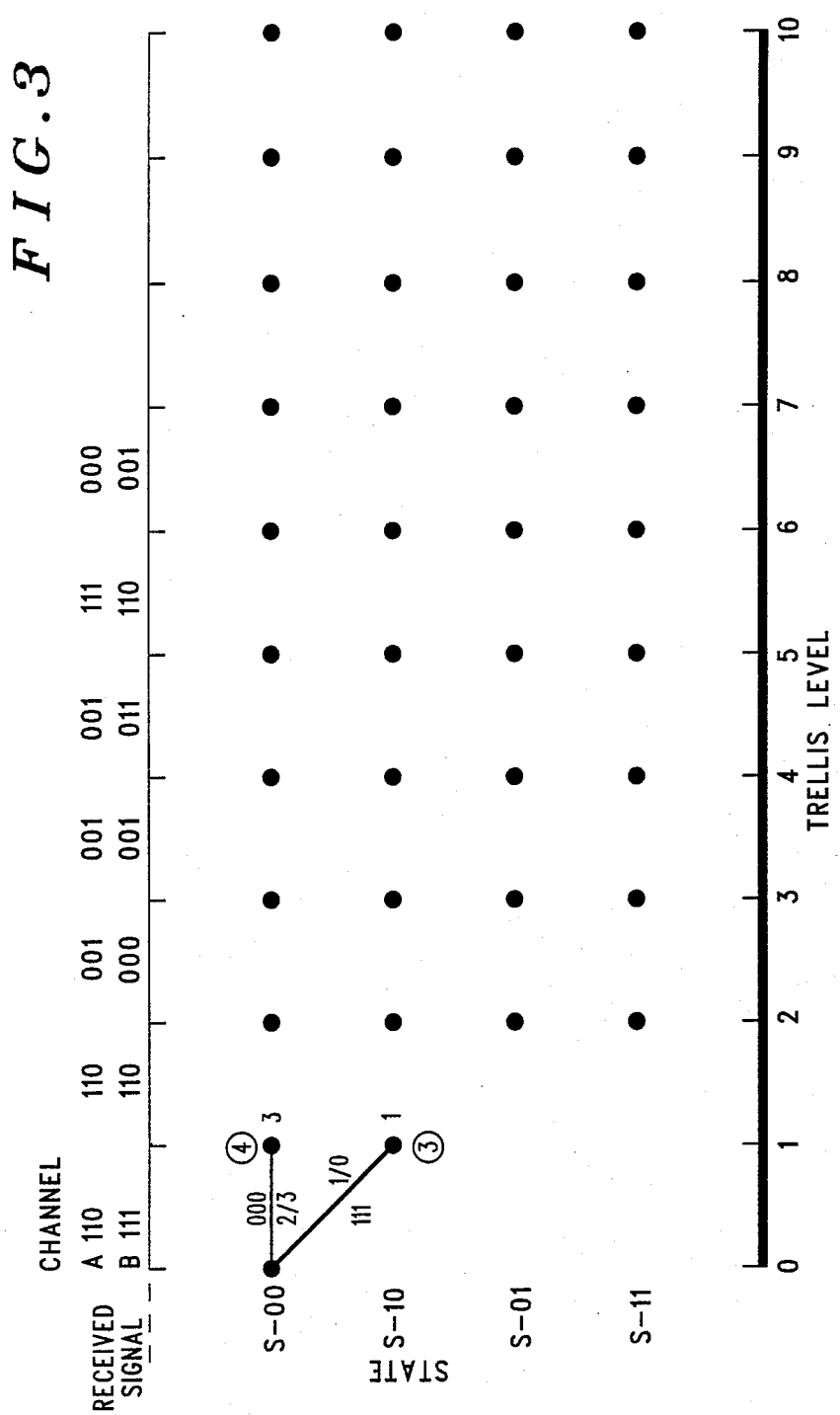

As shown in FIG. 3, assuming the known starting position is the 0,S-00 position, i.e., the state defined as S-00. Further, it may be assumed that the signal received by receiver 10 (signal A) was 110 and the signal received by receiver 12 (signal B) was 111. From 0,S-00 as above described, the possible transitions are 0,S-00 to 1,S10 or, alternatively, 0,S-00 to 1,S-00. If the correct transmission was to be from 0,S-00 to 1,S-00, and the transmitted signal must have been 000. The difference between signal A that necessary to cause transition 0,S-00 to 1,S-00 is 2 while the difference between the correct signal and signal B is 3. These differences or Hamming weights are indicated by 2/3. The Hamming weight of 2 is the lowest and is the Hamming weight retained for 1,S-00 and the Hamming weight 3 is discarded. The retained Hamming weight is shown in a circle at 1,S-00.

On the other hand, if the true signal transmitted was to define a transition 0,S-00 to 1,S-10, the transmitted signal must have been 111 and the difference between received signal A is 1, B is 0, and the two Hamming weights are 1/0. Accordingly, only the 0 is retained at 1,S-10.

Figure 4:
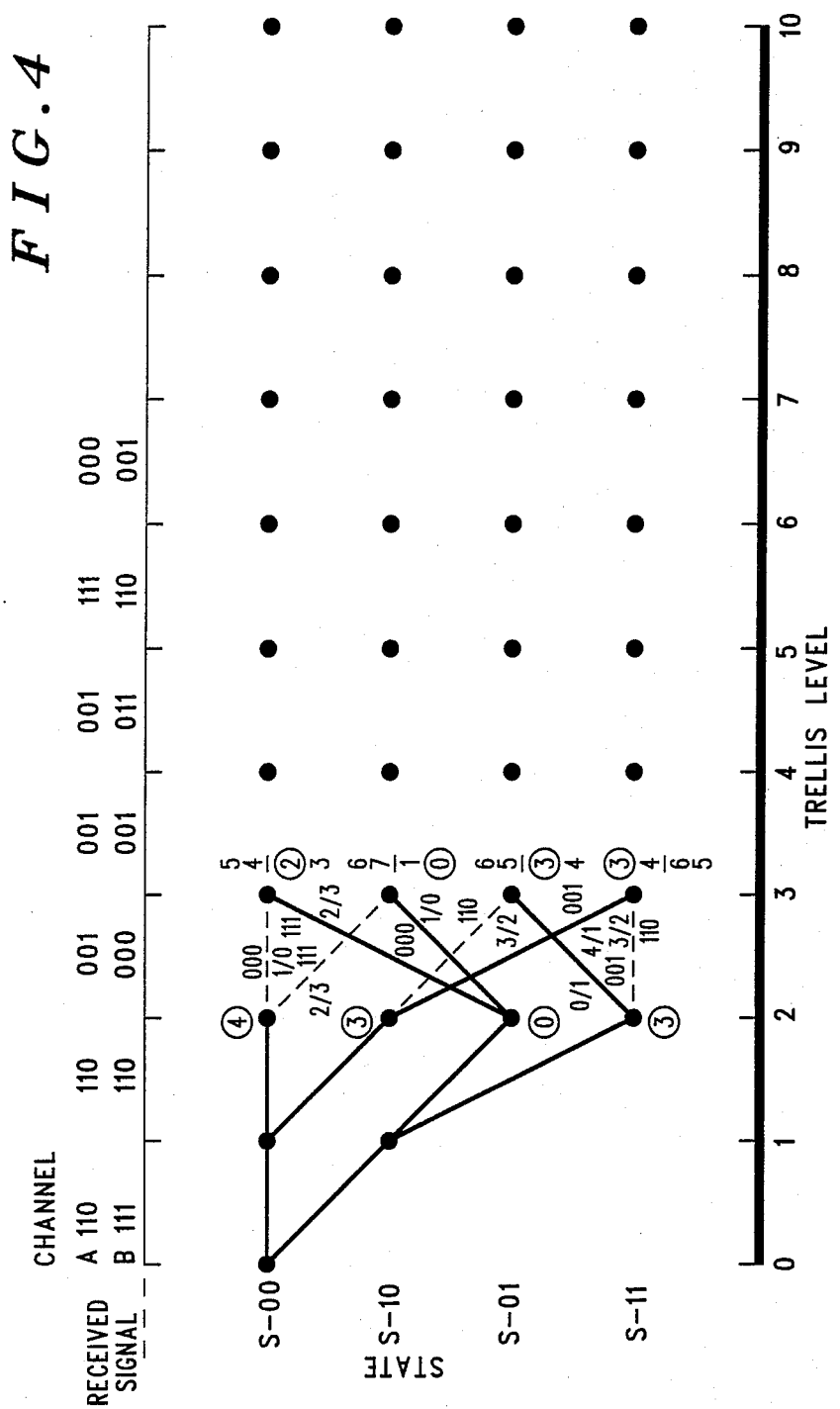

FIG. 4 illustrates the situation several levels farther into the trellis namely to the end of level 3, a point where the first intersection of state transition paths occurs.

It will be noted that at 2,S-00 the metric Hamming weight (total accumulated Hamming weight for the path 0,S-00, to 1,S-00 to 2,S-00) was 4. The Hamming weight for transition 2,S-00 to 3,S-00 is 0. Also arriving at 3,S-00 is a transition from 2,S-01 having a minimum Hamming weight of 2 which obviously is higher than the 0 Hamming weight added by the transition 2,S-00 to 3,S-00. Nevertheless, the total accumulated metric arriving at 3,S-00 from 2,S-01 is only 2 compared to 4 following the intersecting path and, accordingly, the transition 2,S-00 to 3,S-00 is discarded represented by a dashed line, as shown.

Considering these transitions in greater detail, the transition 2,S-00 to 3,S-00 increases the Hamming weight of 4 for the path from 2,S-00 by 1 and 0 for signals A and B respectively. The transition from 2,S-01 to 3,S-00 increases the Hamming weight of 0 for the path from 2,S-01 by 2 and 3 for the signals A and B respectively. The four accumulated Hamming weights at 3,S-00 are 5 and 4 for the path from 2,S-00 to 3,S-00 and 2 and 3 for the path from 2,S-01 to 3,S-00. The maximum likelihood decision rule dictates that the path with the minimum Hamming weight be maintained. The smallest Hamming weight at 3,S-00 is 2 resulting from the path 2,S-01 to 3,S-00, which path is retained and the 2,S-00 to 3,S-00 path (as shown in dashed lines) is discarded and the Hamming weight of 2 is assigned to 3,S-00.

Similarly the transition indicated by the dashed line from 2,S-00 to 3,S-10 results in a minimum accumulated metric at 3,S-10 of 6, whereas the intersecting transition from 2,S-01 to 3,S-10 has a minimum accumulated metric of 0. Thus the transition from 2,S-00 to 3,S-10 is discarded and the Hamming weight of 0 is retained at 3,S-10.

Similarly the transitions indicated by the other dashed lines in FIG. 4 are also discarded because they have the higher Hamming weights at their intersection with another path. Thus the transitions from 2,S-10 to 3,S-01 and from 2,S-11 to 3,S-11 are discarded.

The metric Hamming weights at level 3 in the trellis are at 3,S-00 a weight of 2; at 3,S-10 of 0; at 3,S-01 of 3; and at 3,S11 of 3 as indicated by the numerals appearing within the circles in FIG. 4.

Figure 5:
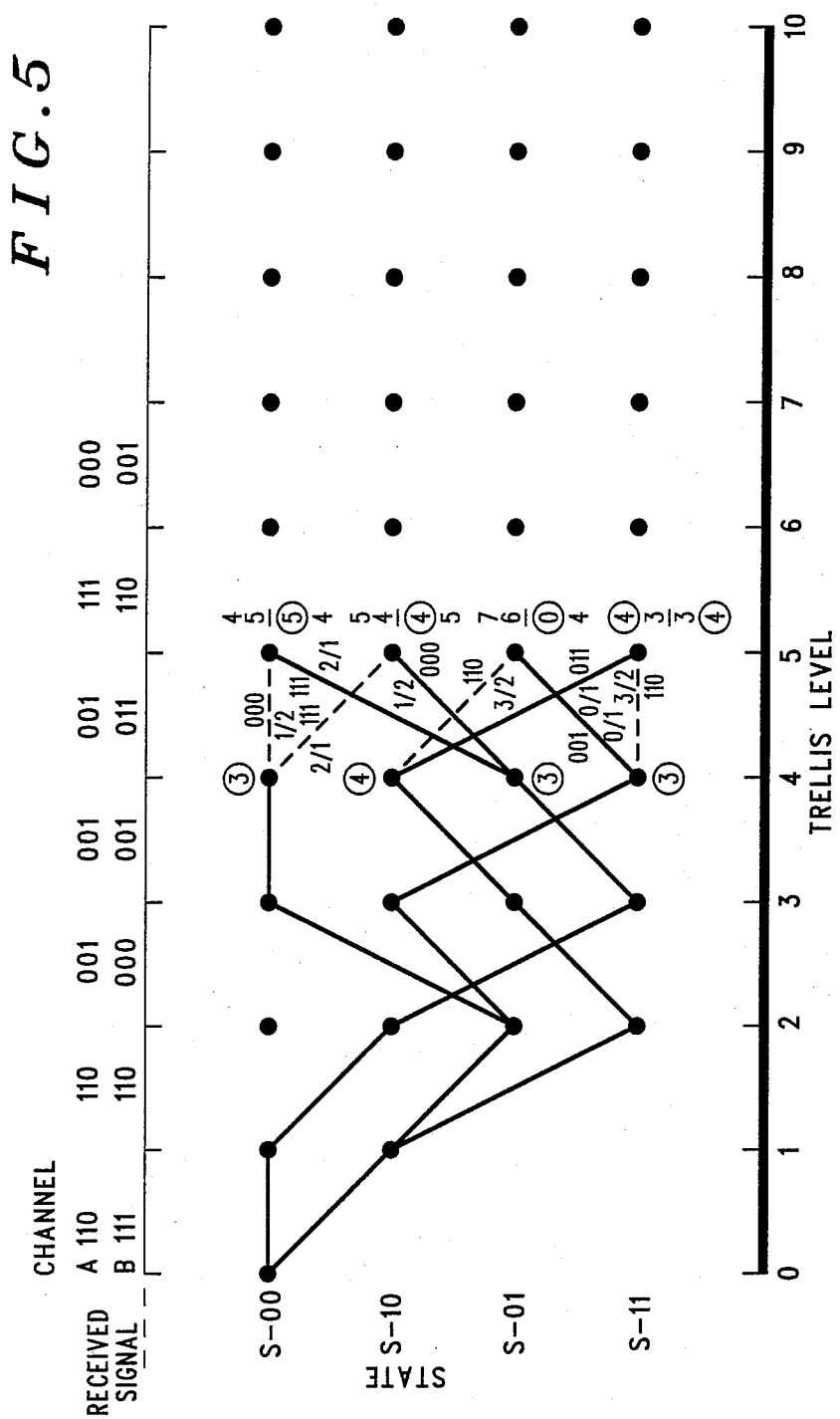

This process is continued as indicated in FIG. 5 to level 5 (the last level to have points at each state). At this level in the example the minimum metric Hamming weight for the paths intersecting at 5,S-00 have the same minimum metric Hamming weight of 4 and by coincidence so do the paths intersecting at 5,S-10. In these cases there are even odds as to which is the correct path and one of the two intersecting paths at each such intersection will be abandoned by an arbitrary or random selection. In this case the transition 4,S-01 to 5,S-00 was retained as was the transition 4,S-01 to 5,S-10 (see FIG. 6).

Figure 6:
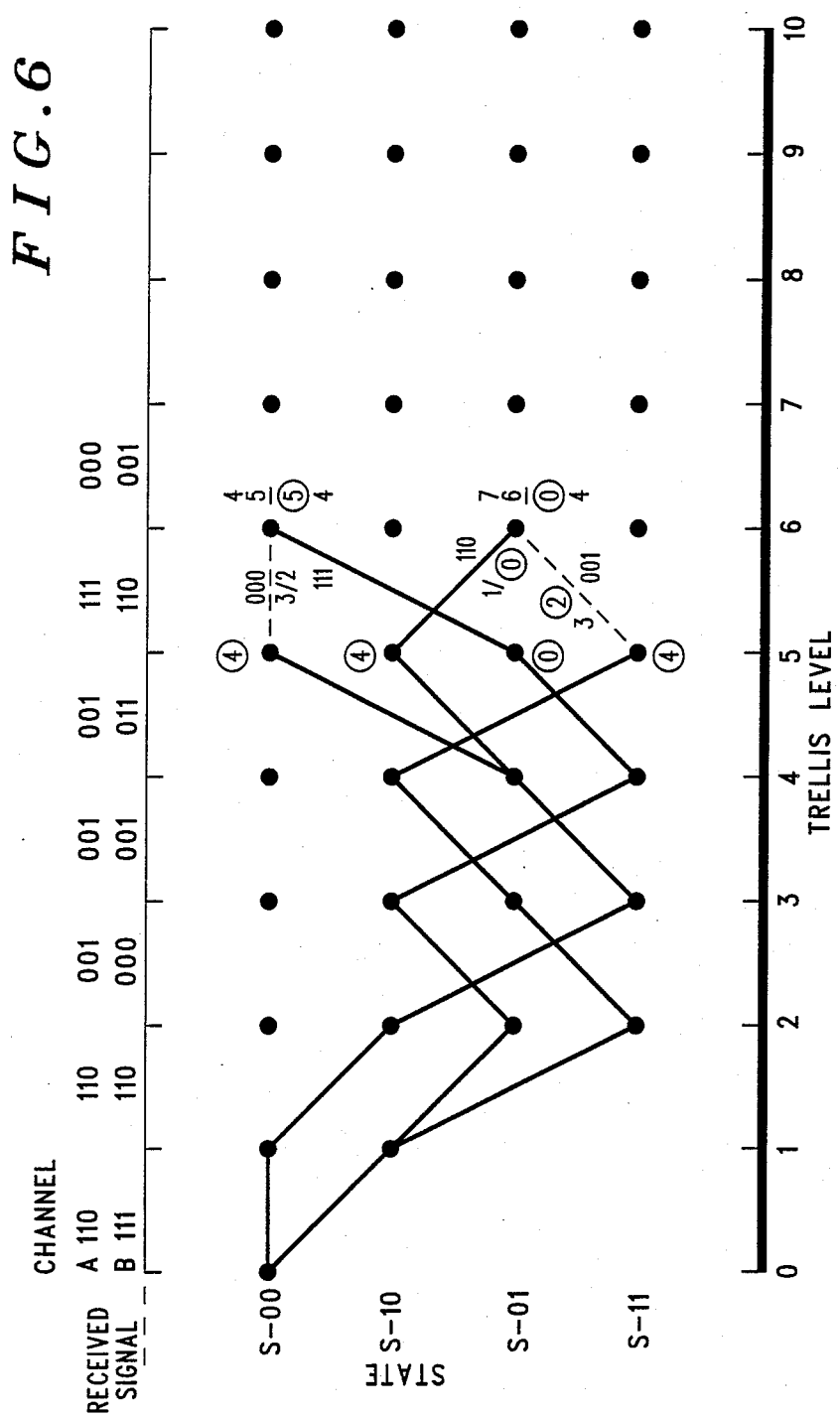

In FIG. 6, at the end of the 6th level, the trellis is reduced from four to two posible states and thus there are two intersections. The path from 5,S-01 to 6,S-00 has a minimum accumulated or metric Hamming weight of 0 and intersects with the path 5,S-00 to 6,S-00 which has a metric of 6 so the transition 5,S-00 to 6,S-00 is discarded. The other intersection, i.e., the transition path from 5,S-10 to 6,S-01 having an accumulated Hamming weight of 4, is retained.

The final path is determined at the intersection at 7,S-00 in FIG. 7 which eliminates the path extending from 6,S-01 to 7,S-00. It is to be noted that this path from 6,S-01 to 7,S-00 is part of one of the two possible paths that start at 0,S-00 and end at 7,S-00. Elimination of this portion of the path eliminates the entire path, leaving only one survivor path in the trellis. The maximum likelihood path is thus defined as being from 0,S-00 to 1,S-10 to 2,S-01 to 3,S-10 to 4,S-11 to 5,S-01 to 6,S-00 to 7,S-00.

This signal path is then transmitted from the path memory 24 to the state decoder 26 where it is decoded and the final decoded signal transmitted as indicated by line F to any suitable equipment or output.

Obviously the more receivers used the greater the likely degree of accuracy of the final resultant path, however for economic reasons it is not recommended to exceed about 4 such receivers. Adequate results significantly better than those that may be obtained using the conventional two receiver systems described hereinabove are obtained using a two receiver system of the present invention as above described.

The invention has been described using a system with a data bit ratio or code rate of 1/3, but any suitable data bit radio or code rate may be used.

Having described the invention, modifications will be evident to those skilled in the art without departing from the true spirit and scope of the invention as defined in the appended claims.

I claim:

1. A method of improving the accuracy of a received message using a maximum likelihood diversity receiver having at least two common site located, spaced receiving antennae, each having its own receiver and receiving a digital signal including the steps of:

processing each of said received digital signals in a trellis error decoder, applying Hamming weights to each of said signals using a Viterbi algorithm, retaining only said Hamming weight so determined having a minimum Hamming weight value for any one state transition path between adjacent levels in said trellis, discarding any Hamming weights relating to said one state transition path higher than said minimum Hamming weight and selecting a maximum likelihood path at any point of intersection of two of said state transition paths at a level in said trellis based on one of said two paths having the lowest total metric Hamming weight accumulated in state transition paths leading to said intersection and discarding the other of said two state transition paths leading to said intersection.

2. A maximum likelihood diversity receiver comprising at least two receivers at a common receiving site, each said receiver having its own antenna, said antennas being separated to receive signals having a low correlation coefficient, each said receiver generating a demodulated signal, including in combination:

a state transition manager for applying Hamming weight to said demodulated signals generated by each receiver for all possible state transition paths across each level in a trellis based on a known starting state, means for determining a minimum Hamming weight of each state transition path across a level in said trellis, means for retaining only the minimum Hamming weight for each said path regardless of the receiver source, path memory means for accumulating minimum Hamming weights for each level in said trellis into a metric for each path until a pair of paths intersect, means for selecting the moth likely path to said intersection based on the one of said intersecting paths having the metric with the minimum Hamming weight and discarding the other path leading to the intersection and means for repeating the process until only a single path remains and state decoder means for decoding said received signal to determine a message based on a remaining single path in said state decoder means.

* * * * *